(12) United States Patent
Yokota et al.

(10) Patent No.: US 10,546,723 B2
(45) Date of Patent: Jan. 28, 2020

(54) PLASMA PROCESSING METHOD

(71) Applicant: TOKYO ELECTRON LIMITED, Tokyo (JP)

(72) Inventors: Akihiro Yokota, Miyagi (JP); Takanori Banse, Miyagi (JP); Joji Takayoshi, Miyagi (JP); Shinya Morikita, Miyagi (JP); Naohiko Okunishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/141,225

(22) Filed: Sep. 25, 2018

(65) Prior Publication Data

US 2019/0096635 A1    Mar. 28, 2019

(30) Foreign Application Priority Data

Sep. 26, 2017   (JP) ................. 2017-185082

(51) Int. Cl.
| | |
|---|---|
| *H01L 21/311* | (2006.01) |
| *H01J 37/32* | (2006.01) |
| *H05H 1/46* | (2006.01) |
| *H01L 21/02* | (2006.01) |
| *H01L 21/3105* | (2006.01) |

(52) U.S. Cl.
CPC .. *H01J 37/32091* (2013.01); *H01J 37/32183* (2013.01); *H01J 37/32532* (2013.01); *H01L 21/0217* (2013.01); *H01L 21/02164* (2013.01); *H01L 21/311* (2013.01); *H01L 21/31055* (2013.01); *H05H 1/46* (2013.01)

(58) Field of Classification Search
USPC ............................................... 216/67
See application file for complete search history.

(56) References Cited

U.S. PATENT DOCUMENTS 8,397,668 B2 * 3/2013 Kobayashi ........ H01J 37/32082
118/715

FOREIGN PATENT DOCUMENTS

JP    2015-173240    10/2015

* cited by examiner

*Primary Examiner* — Roberts P Culbert
(74) *Attorney, Agent, or Firm* — Rothwell, Figg, Ernst & Manbeck, P.C.

(57) ABSTRACT

A plasma processing method for a workpiece in a plasma processing apparatus includes (i) performing a first plasma processing on a workpiece, and (ii) performing a second plasma processing on the workpiece. Power of second radio frequency waves set in the second plasma processing is greater than the power of the second radio frequency waves set in the first plasma processing. In the second plasma processing, a magnetic field distribution having a horizontal component on an edge side of the workpiece greater than a horizontal component on a center of the workpiece is formed by an electromagnet.

7 Claims, 10 Drawing Sheets

PLASMA PROCESSING METHOD

CROSS-REFERENCE TO RELATED APPLICATIONS

This application is based on and claims priority from Japanese Patent Application No. 2017-185082, filed on Sep. 26, 2017, with the Japan Patent Office, the disclosure of which is incorporated herein in its entirety by reference.

TECHNICAL FIELD

Exemplary embodiments of the present disclosure relate to a plasma processing method and a plasma processing apparatus.

BACKGROUND

In the manufacture of an electronic device, a plasma processing method is executed using a plasma processing apparatus to process a workpiece. The plasma processing apparatus generally includes a chamber body, a gas supply unit, a stage, a first radio frequency power supply, and a second radio frequency power supply. The gas supply unit is configured to supply a gas to the inner space of the chamber body. The stage is provided in the inner space of the chamber body and is configured to support a workpiece placed thereon. The workpiece is placed on the stage such that the center thereof is located on a central axis of the chamber body. The stage includes a lower electrode. The first radio frequency power supply is configured to generate first radio frequency waves for generating plasma. The second radio frequency power supply is configured to generate second radio frequency waves. A frequency of the second radio frequency waves is lower than a frequency of the first radio frequency waves. The second radio frequency waves are supplied to the lower electrode. In the plasma processing method using the plasma processing apparatus, the gas is excited in the inner space by the first radio frequency waves, so that plasma is generated. In addition, the second radio frequency waves are supplied to the lower electrode. Thus, ions in the plasma are accelerated toward the workpiece, and the workpiece is irradiated with the accelerated ions.

As a type of plasma processing method, there is a plasma processing method in which two plasma processings are sequentially applied to a workpiece. Such a plasma processing method is described in Japanese Patent Laid-Open Publication No. 2015-173240. The plasma processing method disclosed in Japanese Patent Laid-Open Publication No. 2015-173240 is executed to selectively etch a first region formed of silicon oxide with respect to a second region formed of silicon nitride. In the plasma processing method, a processing using plasma of a fluorocarbon gas and a processing using plasma of a rare gas are executed. In the processing using the plasma of the fluorocarbon gas, a deposit film containing fluorocarbon is formed on the workpiece. While the processing using the plasma of the fluorocarbon gas is executed, power of the second radio frequency waves is set to relatively low power (e.g., 0 watts). In the plasma processing using the rare gas, the workpiece is irradiated with ions of the rare gas. While the plasma processing using the rare gas is executed, the second region is protected by the deposit film, and the first region is etched by radicals of the fluorocarbon in the deposit film. While the plasma processing using the rare gas is executed, power of the second radio frequency waves is set to relatively high power. The plasma processing method is used to form an opening in a self-aligned manner by etching the first region provided in a recess provided by the second region.

SUMMARY

In an aspect, a plasma processing method for a workpiece in a plasma processing apparatus is provided. The plasma processing apparatus includes a chamber body, a stage, a lower electrode, a gas supply unit, a first radio frequency power supply, a second radio frequency power supply, and an electromagnet. The stage provides a placing region for a workpiece, and is provided in an inner space. The center of the placing region is located on a central axis of the chamber body. The lower electrode is provided in the stage. The gas supply unit is configured to supply a first gas and a second gas to the inner space of the chamber body. The first radio frequency power supply is configured to supply first radio frequency waves. The second radio frequency power supply is configured to supply second radio frequency waves and is electrically connected to the lower electrode. A frequency of the second radio frequency waves is lower than a frequency of the first radio frequency waves. The electromagnet is configured to form a magnetic field in the inner space of the chamber body.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
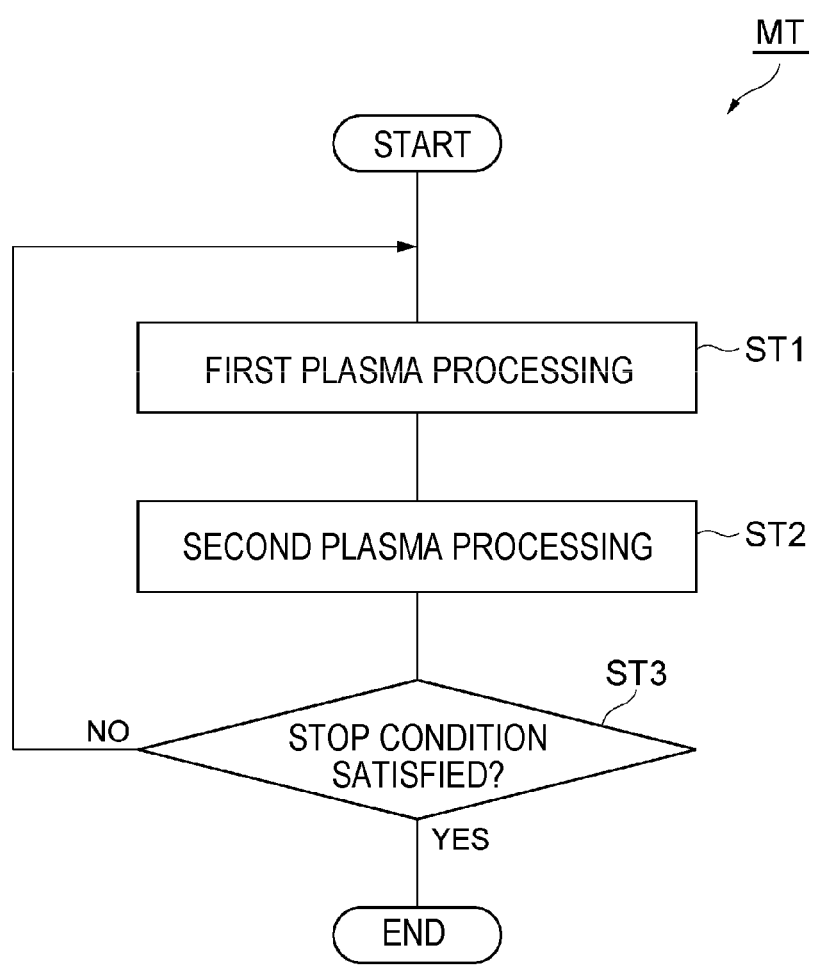
FIG. 1 is a flowchart illustrating a plasma processing method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

With the miniaturization of an electronic device, the width of the above-described recess is small. When a deposit is thickly formed on the first region that is present in the narrow recess, the etching of the first region is not performed by the plasma processing using the rare gas. Thus, it is necessary to reduce the film thickness of the deposit film formed on the workpiece. When the film thickness of the deposit film is small, in order to prevent the etching of the second region, it is necessary to lower the energy of the ions of the rare gas with which the workpiece is irradiated. In order to lower the energy of the ions, it is conceivable to use the second radio frequency waves having a radio frequency. When the frequency of the second radio frequency waves is high, an electric field intensity distribution having a high electric field intensity on the center of the workpiece and a low electric field intensity on the edge side of the workpiece is formed. That is, a non-uniform electric field intensity distribution is formed in the inner space such that the electric field intensity decreases as the distance from the central axis in a radiation direction increases. As a result, a non-uniform plasma density distribution is formed in the radiation direction with respect to the central axis. Such a plasma density distribution gives rise to non-uniformity of a plasma processing in a radial direction. Thus, it is required to make a uniform plasma density distribution in the plasma processing using the rare gas. In addition, in an arbitrary plasma processing method including a first plasma processing in which the power of the second radio frequency waves (bias radio frequency waves) is set to low power and a second plasma processing in which power of the second radio frequency waves is set to high power, it is also required to make a uniform plasma density distribution during execution of the second plasma processing.

In an aspect, a plasma processing method for a workpiece in a plasma processing apparatus is provided. The plasma processing apparatus includes a chamber body, a stage, a lower electrode, a gas supply unit, a first radio frequency power supply, a second radio frequency power supply, and an electromagnet. The stage provides a placing region for a workpiece, and is provided in an inner space. The center of the placing region is located on a central axis of the chamber body. The lower electrode is provided in the stage. The gas supply unit is configured to supply a first gas and a second gas to the inner space of the chamber body. The first radio frequency power supply is configured to supply first radio frequency waves. The second radio frequency power supply is configured to supply second radio frequency waves and is electrically connected to the lower electrode. A frequency of the second radio frequency waves is lower than a frequency of the first radio frequency waves. The electromagnet is configured to form a magnetic field in the inner space of the chamber body.

A plasma processing method according to an aspect is executed in a state where a workpiece is accommodated in an inner space of a chamber body. The plasma processing method includes (i) performing a first plasma processing on the workpiece by plasma generated from a first gas supplied to the inner space, and (ii) performing a second plasma processing on the workpiece by plasma generated from a second gas supplied to the inner space. Power of the second radio frequency waves set in the second plasma processing is greater than power of the second radio frequency waves set in the first plasma processing. In the second plasma processing, a magnetic field distribution having a horizontal component on an edge side of the workpiece that is greater than a horizontal component on a center of the workpiece is formed by the electromagnet.

In the plasma processing method according to the aspect, while the second plasma processing is executed, an electric field intensity increases on the center of the workpiece, and the electric field intensity decreases on the edge side of the workpiece. That is, while the second plasma processing is executed, a non-uniform electric field intensity distribution is formed in a radiation direction with respect to a central axis. In addition, while the second plasma processing is executed, the above-described magnetic field distribution is formed in the inner space. In a portion in which the magnetic field having the greater horizontal component is formed, the stay time of electrons increases. As a result, the density of plasma increases in the portion in which the magnetic field having the greater horizontal component is formed. Therefore, a plasma density distribution becomes uniform during execution of the second plasma processing. Moreover, since the plasma density distribution becomes uniform by the magnetic field distribution formed by the electromagnet, the plasma density distribution may become uniform at a high speed at a point in time at which a plasma processing to be executed is switched from the first plasma processing to the second plasma processing.

In an embodiment, the executing the first plasma processing and the executing the second plasma processing are alternately repeated. Even when the first plasma processing and the second plasma processing are alternately repeated, the plasma density distribution may become uniform at a high speed at a point in time at which a plasma processing to be executed is switched from the first plasma processing to the second plasma processing.

In an embodiment, the workpiece includes a first region formed of silicon oxide and a second region formed of silicon nitride. The first gas includes a fluorocarbon gas. In the first plasma processing, a deposit film containing fluorocarbon is formed on the workpiece. The second gas includes a rare gas. In the second plasma processing, the workpiece having the deposit film formed thereon is irradiated with ions of the rare gas to etch the first region. In the embodiment, since the second region is protected by the deposit film and the first region is etched, the first region is selectively etched with respect to the second region.

In an embodiment, a recess provided by the second region includes the first region. In the embodiment, the first region provided in the recess of the second region is etched, so that an opening is formed in a self-aligned manner.

In an embodiment, the frequency of the second radio frequency waves is greater than 13.56 MHz. In an embodiment, the frequency of the second radio frequency waves is equal to or greater than 40 MHz. In an embodiment, the frequency of the second radio frequency waves is equal to or greater than 60 MHz.

As described above, in a plasma processing method including a first plasma processing and a second plasma processing, a plasma density distribution may become uniform during execution of the second plasma processing in which power of bias radio frequency waves is set to relatively high power.

Hereinafter, various embodiments will be described in detail with reference to the accompanying drawings. In addition, in the respective drawings, the same reference numerals will be attached to the same or corresponding parts.

FIG. 1 is a flowchart illustrating a plasma processing method according to an embodiment. The plasma processing method (hereinafter referred to as "method MT") illustrated in FIG. 1 is executed in a state where a workpiece is accommodated in an inner space of a chamber body of a plasma processing apparatus.

Figure 2:
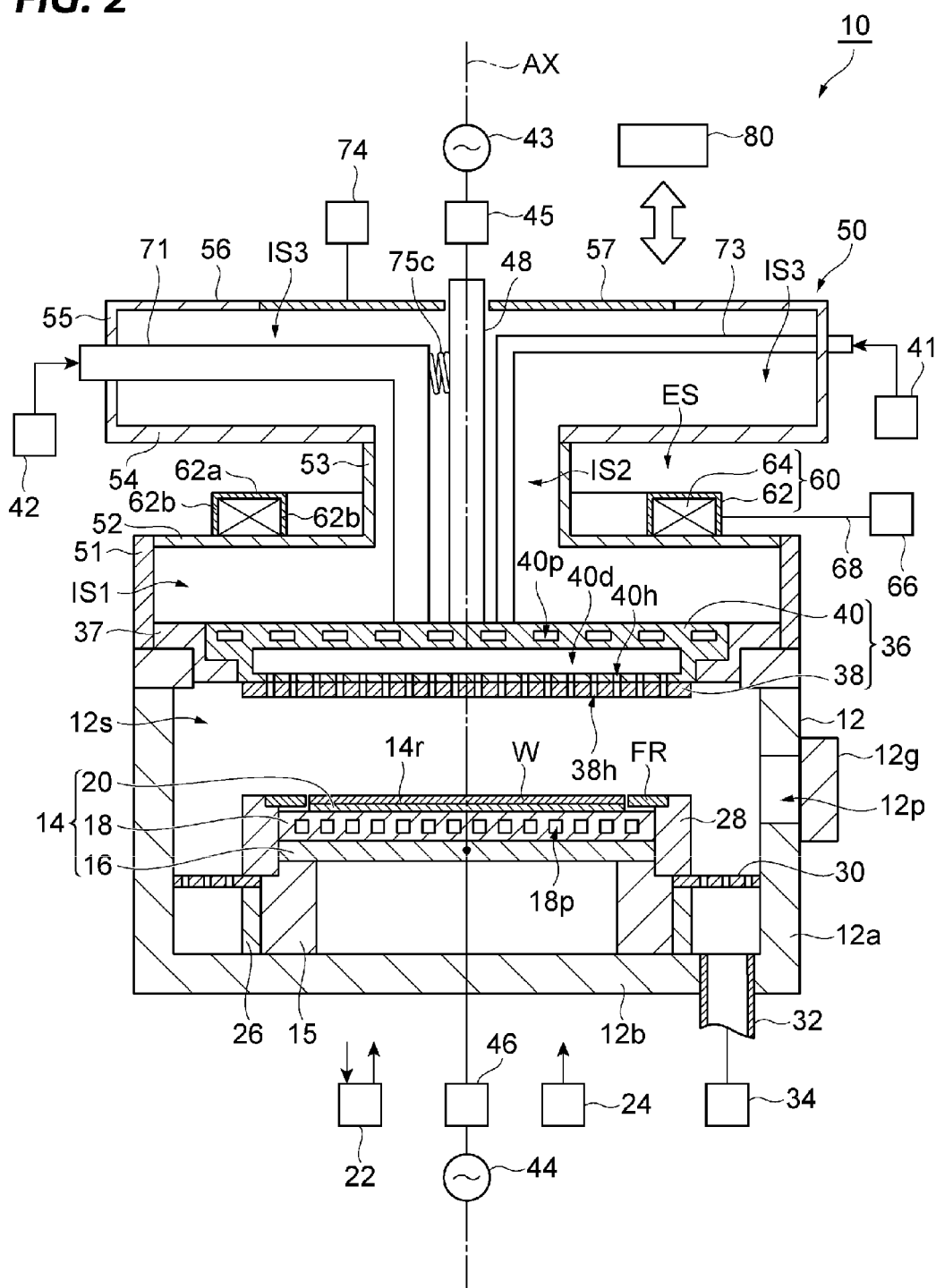
FIG. 2 is a view schematically illustrating an embodiment of a plasma processing apparatus that may be used to execute the plasma processing method illustrated in FIG. 1.

FIG. 2 is a view schematically illustrating an embodiment of a plasma processing apparatus that may be used to execute the plasma processing method illustrated in FIG. 1. In FIG. 2, the plasma processing apparatus 10 of the embodiment is illustrated as being partially broken in a vertically extending plane. The plasma processing apparatus 10 illustrated in FIG. 2 includes a chamber body 12. The chamber body 12 has a cylindrical shape, and includes a sidewall 12a and a bottom portion 12b. The chamber body 12 provides an inner space 12s. A central axis AX illustrated in FIG. 2 is a central axis of the chamber body 12 and the inner space 12s. The chamber body 12 is formed of a metal such as, for example, aluminum. The inner wall surface of the chamber body 12 is formed with a film having plasma resistance. This film may be a ceramic film such as an alumite film or a yttrium oxide film. The chamber body 12 is grounded.

The sidewall 12a is formed with a passage 12p. The workpiece W passes through the passage 12p when transferred between the inner space 12s and the outside of the chamber body 12. The workpiece W may have a disk shape like a wafer. The passage 12p may be opened and closed by a gate valve 12g. The gate valve 12g is provided along the sidewall 12a.

A stage 14 is provided in the inner space 12s. The stage 14 is supported by a support member 15. The support member 15 has a cylindrical shape and extends upward from the bottom portion 12b of the chamber body 12. The support member 15 has insulation, and is formed of a ceramic, for example.

The stage 14 is configured to support the workpiece W. The stage 14 shares the central axis AX with the chamber body 12. The stage 14 provides a placing region 14r. The center of the placing region 14r is located on the central axis AX. The workpiece W is placed on the placing region 14r so that the center thereof is located on the central axis AX.

The stage 14 includes an electrode plate 16, a lower electrode 18, and an electrostatic chuck 20. The electrode plate 16 has a substantially disk shape. The electrode plate 16 has conductivity. The electrode plate 16 is formed of a metal such as aluminum. The lower electrode 18 has a disk shape. The lower electrode 18 has conductivity. The lower electrode 18 is formed of a metal such as aluminum. The lower electrode 18 is mounted on the electrode plate 16. The lower electrode 18 is electrically connected to the electrode plate 16.

A flow path 18p is formed in the lower electrode 18. The flow path 18p extends, for example, in a spiral shape in the lower electrode 18. A heat exchange medium (e.g., a coolant) is supplied to the flow path 18p from a circulation device 22 (e.g., a chiller unit) for the heat exchange medium. The circulation device 22 is provided outside the chamber body 12. The heat exchange medium supplied to the flow path 18p returns to the circulation device 22. By heat exchange between the heat exchange medium and the lower electrode 18, the temperature of the workpiece W placed on the stage 14 is controlled.

The electrostatic chuck 20 is provided on the lower electrode 18. The electrostatic chuck 20 has a substantially disk shape. The electrostatic chuck 20 includes a film-shaped electrode in a ceramic body. A DC power supply 24 is connected to the electrode of the electrostatic chuck 20 via a switch. The electrostatic chuck 20 provides the placing region 14r described above. When a DC voltage is applied from the DC power supply 24 to the electrode of the electrostatic chuck 20 in a state where the workpiece W is placed on the electrostatic chuck 20 (on the placing region 14r), an electrostatic attractive force is generated between the workpiece W and the electrostatic chuck 20. The workpiece W is attracted to the electrostatic chuck 20 and held by the electrostatic chuck 20 by the generated electrostatic attractive force. The plasma processing apparatus 10 may be provided with a heat transfer gas supply line that supplies a heat transfer gas (e.g., He gas) to a gap between the electrostatic chuck 20 and the lower surface of the workpiece W.

One or more heaters (e.g., one or more resistance heating elements) may be provided inside the electrostatic chuck 20. When power is supplied from a heater controller to the one or more heaters, the one or more heaters generate heat, so that the temperature of the electrostatic chuck 20, and consequently, the temperature of the workpiece W are adjusted.

In the inner space 12s of the chamber body 12, a focus ring FR is disposed so as to surround the edges of the electrostatic chuck 20 and the workpiece W. The focus ring FR is an annular plate and is formed of a silicon containing material such as silicon or quartz. The focus ring FR is used to obtain uniformity of a plasma processing.

A cylindrical conductor 26 is provided around the support member 15. The conductor 26 is grounded. A cylindrical insulator 28 is provided above the conductor 26 so as to surround the stage 14. The insulator 28 is formed of a ceramic such as quartz. An exhaust path is formed between the stage 14 and the sidewall 12a of the chamber body 12. A baffle plate 30 is provided in the exhaust path. The baffle plate 30 is an annular plate. The baffle plate 30 is formed with a large number of holes in a plate thickness direction thereof. The baffle plate 30 is configured by forming a plasma resistant film such as an yttrium oxide film on the surface of a base material formed of a metal such as aluminum.

An exhaust pipe 32 is connected to the bottom portion 12b of the chamber body 12 under the baffle plate 30. The exhaust pipe 32 may communicate with the exhaust path. An exhaust device 34 is connected to the exhaust pipe 32. The exhaust device 34 includes an automatic pressure control valve and a pressure reduction pump such as a turbo molecular pump. When the exhaust device 34 is operated, the pressure in the inner space 12s is set to a designated pressure.

An upper electrode 36 is provided above the stage 14. A portion of the inner space 12s is interposed between the upper electrode 36 and the stage 14. The upper electrode 36 is provided so as to close an upper opening in the chamber body 12. A member 37 is interposed between the upper electrode 36 and the upper end portion of the chamber body 12. The member 37 is formed of an insulation material. The member 37 may be formed of a ceramic, for example, quartz. In addition, in an embodiment, the member 37 and a portion of the grounded conductor to be described later may be interposed between the upper electrode 36 and an upper end portion of the chamber body 12.

In an embodiment, the upper electrode 36 constitutes a showerhead. In an embodiment, the upper electrode 36 includes an upper plate 38 and a support member 40. The upper plate 38 is formed of, for example, silicon. Alternatively, the upper plate 38 is configured by providing a coating formed of a ceramic such as yttrium oxide on the surface of a base material formed of aluminum. The upper plate 38 is formed with a plurality of gas discharge holes 38h in a plate thickness direction thereof.

The support member 40 is provided on the upper plate 38. The support member 40 is configured to detachably support the upper plate 38. The support member 40 is formed of a conductive material such as aluminum. A gas diffusion chamber 40d is formed inside the support body 40. A plurality of holes 40h are formed in the support member 40 so as to extend downward from the gas diffusion chamber 40d. The holes 40h are respectively in communication with the gas discharge holes 38h.

A gas supply unit 41 is connected to the gas diffusion chamber 40d. The gas supply unit 41 is configured to supply a gas to the inner space 12s. In an embodiment, the gas supply unit 41 is configured to be able to output a first gas and a second gas. The first gas and the second gas will be described later. In addition, the gas supply unit 41 includes one or more flow rate controllers and one or more valves, and is configured to individually adjust the flow rates of one or more gases to be output. The gas output from the gas supply unit 41 is discharged into the inner space 12s from the plurality of gas discharge holes 38h through the gas diffusion chamber 40d and the plurality of holes 40h.

A flow path 40p is formed in the support member 40. A chiller unit 42 is connected to the flow path 40p. A coolant such as cooling water is circulated between the flow path 40p and the chiller unit 42. The temperature of the upper electrode 36 is adjusted by heat exchange between the upper electrode 36 and the coolant supplied from the chiller unit 42 to the flow path 40p.

The plasma processing apparatus 10 further includes a first radio frequency power supply 43 and a second radio frequency power supply 44. The first radio frequency power supply 43 and the second radio frequency power supply 44 are provided outside the chamber body 12. The first radio frequency power supply 43 is configured to mainly generate first radio frequency waves for generating plasma. The first radio frequency waves may have a frequency such as, for example 100 MHz, but is not limited thereto. The first radio frequency power supply 43 is electrically connected to the upper electrode 36 via a matcher 45 and a power supply conductor 48. The matcher 45 includes a matching circuit for matching the output impedance of the first radio frequency power supply 43 with the impedance of a load side (the upper electrode 36 side). The power supply conductor 48 is connected at the lower end thereof to the upper electrode 36. The power supply conductor 48 extends upward from the upper electrode 36. The power supply conductor 48 is a cylindrical or rod-shaped conductor, and the central axis of the power supply conductor 48 substantially coincides with the central axis AX.

The second radio frequency power supply 44 is configured to mainly generate second radio frequency waves, that is, bias radio frequency waves, for introducing ions into the workpiece W. A frequency of the second radio frequency waves is lower than a frequency of the first radio frequency waves. In an embodiment, the frequency of the second radio frequency waves is greater than 13.56 MHz. In an embodiment, the frequency of the second radio frequency waves may be equal to or greater than 40 MHz. In an embodiment, the frequency of the second radio frequency waves may be equal to or greater than 60 MHz. The second radio frequency power supply 44 is electrically connected to the lower electrode 18 via a matcher 46. The matcher 46 includes a matching circuit for matching the output impedance of the second radio frequency power supply 44 with the impedance of a load side (the lower electrode 18 side).

The plasma processing apparatus 10 further includes a grounded conductor 50. The grounded conductor 50 has conductivity. The grounded conductor 50 is formed of a metal such as aluminum. The grounded conductor 50 is grounded. The grounded conductor 50 extends so as to cover the upper electrode 36 above the chamber body 12. The power supply conductor 48 extends upward to the outside of the grounded conductor 50 through the space surrounded by the grounded conductor 50, and is connected to the first radio frequency power supply 43 via the matcher 45 outside the grounded conductor 50.

Figure 3:
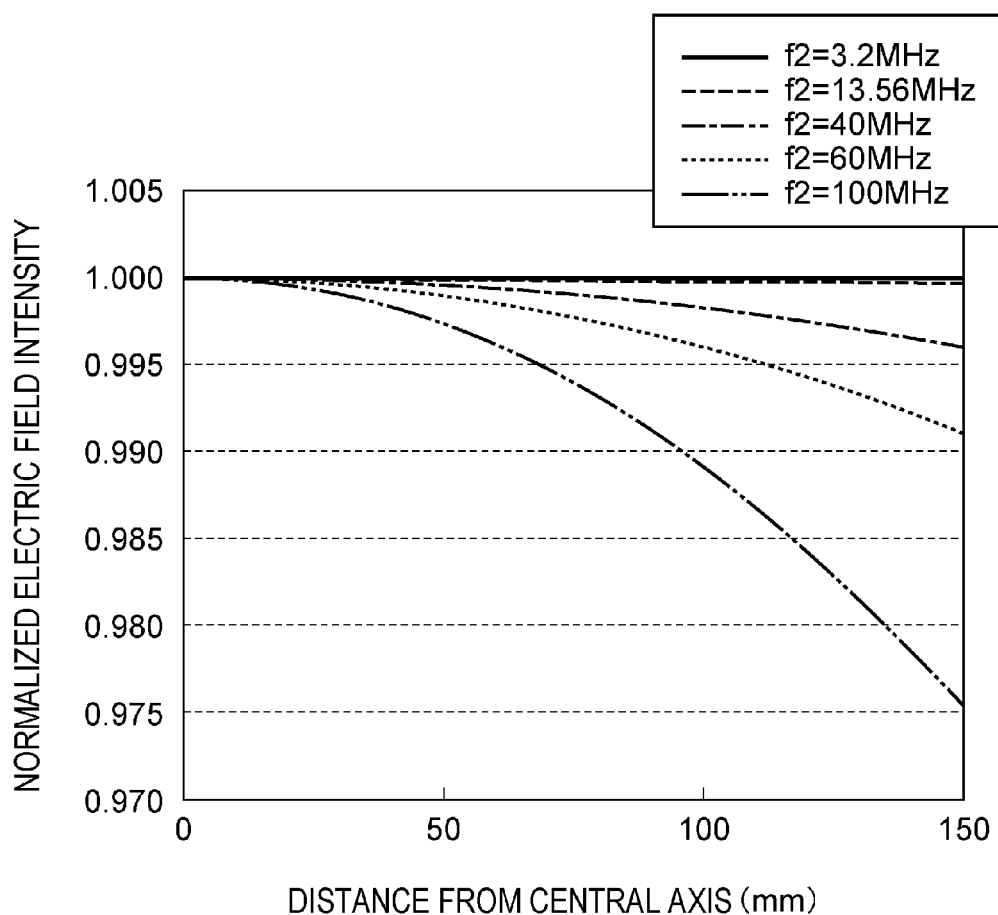
FIG. 3 is a graph illustrating a calculation result of an electric field intensity distribution in an inner space of a chamber body.

In the inner space 12s of the chamber body 12 of the plasma processing apparatus 10, an electric field intensity distribution having a high electric field intensity on the center of the workpiece W and a low electric field intensity on the edge side of the workpiece W may be formed. That is, a non-uniform electric field intensity distribution in which the electric field intensity decreases as the distance from the central axis AX increases in a radiation direction (i.e., a radial direction) may be formed in the inner space 12s. FIG. 3 is a graph illustrating a calculation result of the electric field intensity distribution in the inner space of the chamber body. In FIG. 3, the horizontal axis indicates the distance from the central axis AX in the radiation direction, and the vertical axis indicates the normalized electric field intensity. FIG. 3 illustrates a distribution of the normalized electric field intensity in a case using each of a plurality of frequencies f2 of the second radio frequency waves. As illustrated in FIG. 3, the non-uniformity of the electric field intensity in the radiation direction becomes conspicuous as the frequency f2 of the second radio frequency waves increases. In addition, when the frequency f2 of the second radio frequency waves is set to a radio frequency, the energy of ions with which the workpiece W is irradiated decreases.

Under the above-described non-uniform electric field intensity distribution, the plasma density is high near the central axis and is low in a portion distant from the central axis. That is, a non-uniform plasma density distribution is formed in the radiation direction with respect to the central axis. The plasma processing apparatus 10 further includes an electromagnet 60 in order to obtain a uniform plasma density distribution even in a processing in which the above-described non-uniform electric field intensity distribution is formed, e.g., a processing using the second radio frequency waves having a radio frequency.

As illustrated in FIG. 2, the electromagnet 60 is disposed above the upper electrode 36. The electromagnet 60 forms a magnetic field distribution having a horizontal component at a position spaced apart from the central axis AX greater than a horizontal component on the central axis AX in the inner space 12s of the chamber body 12. That is, the electromagnet 60 forms, in the inner space 12s, a magnetic field distribution having a horizontal component, the magnitude of which increases as the distance from the central axis AX increases in the radiation direction. In a portion in which a magnetic field having a high horizontal component is formed, the stay time of electrons increases. As a result, the density of plasma increases in the portion in which the magnetic field having the high horizontal component is formed. Thus, with the plasma processing apparatus 10, it is possible to obtain a uniform plasma density distribution in the radiation direction with respect to the central axis AX. Therefore, with the plasma processing apparatus 10, the in-plane uniformity of a processing on the workpiece W is improved.

In an embodiment, the electromagnet 60 includes a yoke 62 and a coil 64. The yoke 62 is formed of a magnetic material. The yoke 62 includes a base portion 62a and a plurality of cylindrical portions 62b. The base portion 62a has a substantially disc shape and extends in a direction orthogonal to the central axis AX. Each of the plurality of cylindrical portions 62b has a cylindrical shape and extends downward from the base portion 62a. The plurality of cylindrical portions 62b are provided coaxially with the central axis AX. The coil 64 is wound around the central axis AX. The coil 64 is provided between two adjacent cylindrical portions 62b in the radial direction. In addition, the electromagnet 60 may include one or more coils 64. When a plurality of coils 64 are present in the electromagnet 60, the plurality of coils 64 are provided coaxially with the central axis AX.

The coil 64 of the electromagnet 60 is connected to a current source 66 via a wire 68. When current is applied from the current source 66 to the coil 64, a magnetic field is formed by the electromagnet 60. Since the electron confinement effect (the effect of preventing diffusion of electrons) in the radiation direction (the radial direction) and the effect of preventing extinction of electrons (the effect of preventing electrons from reaching an electrode) are well compatible with each other in a portion in which the angle of a vector of the magnetic field formed by the electromagnet 60 is 45°, the density of plasma increases in the corresponding portion. Thus, when the radius of the workpiece W is 150 mm, the electromagnet 60 may be configured such that the distance between the portion in which the angle of the vector of the magnetic field is 45° and the central axis AX is 135 mm or more and 185 mm or less. Therefore, in an embodiment, the average value of the inner diameter and the outer diameter of one coil 64 of the electromagnet 60 is equal to or greater than the distance between the central axis AX and the edge of the workpiece W. When the radius of the workpiece W is 150 mm, the average value of the inner diameter and the outer diameter of one coil 64 of the electromagnet 60 is 150 mm or more and 250 mm or less. In addition, the angle of the vector of the magnetic field is 0° when the magnetic field has only a downward component, and is 90° when the magnetic field has only a component in the radiation direction (horizontal component). Thus, when the angle of the vector of the magnetic field is 45°, the magnetic field has both a horizontal component and a vertical component.

When the electromagnet 60 is disposed in the space surrounded by the grounded conductor covering the upper electrode, the first radio frequency waves are introduced into the electromagnet 60 and/or a wire that interconnects the electromagnet 60 and a power supply (current source). As a result, the electric field intensity in the inner space 12s of the chamber body 12 varies locally. Thus, the electromagnet 60 is disposed outside the grounded conductor. However, when the electromagnet 60 is disposed in the space above the upper end of the grounded conductor, since the distance in the vertical direction from the electromagnet 60 to the inner space 12s increases, it is impossible to efficiently form a magnetic field having a sufficient magnitude in the inner space 12s unless large current is applied to the coil 64. In addition, when the electromagnet 60 is disposed on the lateral side of the grounded conductor (outside the grounded conductor in the radiation direction from the central axis), the portion in which the magnetic field having the high horizontal component is formed, or the portion in which the magnetic field, the vector of which has an angle of 45°, is not formed in the inner space 12s. In order to efficiently form a magnetic field distribution suitable for obtaining a uniform plasma density distribution in the inner space 12s, the grounded conductor 50 provides an external space ES in which the electromagnet 60 is disposed. The external space ES is located closer to the inner space 12s than the upper end of the grounded conductor 50, is separated upward from the upper electrode 36, and is shielded from the upper electrode 36 by the grounded conductor 50.

The grounded conductor 50 includes a first portion 51, a second portion 52, and a third portion 53. The first portion 51 has a cylindrical shape. A central axis of the first portion 51 substantially coincides with the central axis AX. The first portion 51 extends upward from the chamber body 12. In an example illustrated in FIG. 2, the first portion 51 extends upward from the upper end of the sidewall 12a of the chamber body 12. A lower end portion of the first portion 51 is interposed between the member 37 and the upper end of the sidewall 12a.

The second portion 52 is spaced apart upward from the upper electrode 36, and extends from the first portion 51 toward the central axis AX. The second portion 52 takes the form of a plate that extends in a direction crossing or orthogonal to the central axis AX. The first portion 51 and the second portion 52 provide a first space IS1 above the upper electrode 36. The first space IS1 is a portion of the space inside the grounded conductor 50 (i.e., on the upper electrode 36 side). The first space IS1 provides the distance in the vertical direction between the upper electrode 36 and the grounded conductor 50. Thus, capacitive coupling between the grounded conductor 50 and the upper electrode 36 is prevented. The distance in the vertical direction between the upper surface of the upper electrode 36 and the lower surface of the second portion 52 of the grounded conductor 50 is set to a distance of 60 mm or more, for example.

The third portion 53 has a cylindrical shape. A central axis of the third portion 53 substantially coincides with the central axis AX. The third portion 53 extends closer to the central axis than the first portion 51. The third portion 53 extends upward from the second portion 52. The third portion 53 provides a second space IS2. The second space IS2 is the space inside the second portion 52, and is a portion of the space inside the grounded conductor 50 (i.e., on the upper electrode 36 side). The second space IS2 is continuous with the first space IS1. In addition, the power supply conductor 48 extends upward through the first space IS1 and the second space IS2.

The external space ES is provided by the grounded conductor 50 at the outside of the third portion 53, on the second portion 52, and above the interior space 12s. The external space ES extends in a circumferential direction around the central axis AX at the outside of the third portion 53 and on the second portion 52. The electromagnet 60 is disposed in the external space ES. In addition, the distance in the vertical direction between the lower end of the electromagnet 60 disposed in the external space ES and the upper surface of the upper electrode 36 is greater than 60 mm, and the distance in the vertical direction between the lower end of the electromagnet 60 and the workpiece W placed on the stage 14 may be equal to or less than 230 mm.

The distance between the electromagnet 60 disposed in the external space ES and the inner space 12s is relatively short. In addition, as described above, the electromagnet 60 forms, in the inner space 12s, a magnetic field distribution having a low horizontal component near the central axis AX and a high horizontal component in a position distant from the central axis. Thus, by the electromagnet 60 disposed outside the grounded conductor 50, a magnetic field distribution suitable for obtaining a uniform plasma density distribution may be efficiently formed in the inner space 12s.

The current source 66 is connected to the coil 64 of the electromagnet 60 as described above. The electromagnet 60 and the current source 66 are disposed outside the grounded conductor 50. Thus, a filter for preventing high-frequency waves from being introduced into the current source 66 may not be provided between the coil 64 and the current source 66.

In an embodiment, the grounded conductor 50 further includes a fourth portion 54, a fifth portion 55, and a sixth portion 56. The fourth portion 54 extends above the second portion 52 from the third portion 53 in the radiation direction with respect to the central axis AX. The fourth portion 54 takes the form of a plate that extends in a direction crossing or orthogonal to the central axis AX. The fifth portion 55 has a cylindrical shape. A central axis of the fifth portion 55 substantially coincides with the central axis AX. The fifth portion 55 is farther away from the central axis than the third portion 53, and extends upward from the fourth portion 54. The sixth portion 56 extends above the fourth portion 54 from the fifth portion 55 toward the central axis AX. The sixth portion 56 takes the form of a plate that extends in a direction crossing or orthogonal to the central axis AX. In an embodiment, the grounded conductor 50 further includes a lid portion 57 that extends from the sixth portion to the vicinity of the power supply conductor 48.

The fourth portion 54, the fifth portion 55, and the sixth portion 56 provide a third space IS3. The third space IS 3 is the space surrounded by the fourth portion 54, the fifth portion 55, and the sixth portion 56, and is a portion of the space inside the grounded conductor 50. The third space IS3 is continuous with the second space IS2. The power supply conductor 48 further extends upward through the third space IS3. In addition, in the example illustrated in FIG. 2, the first to sixth portions are configured by three members, but the number of members constituting the grounded conductor 50 may be any other number.

Figure 4:
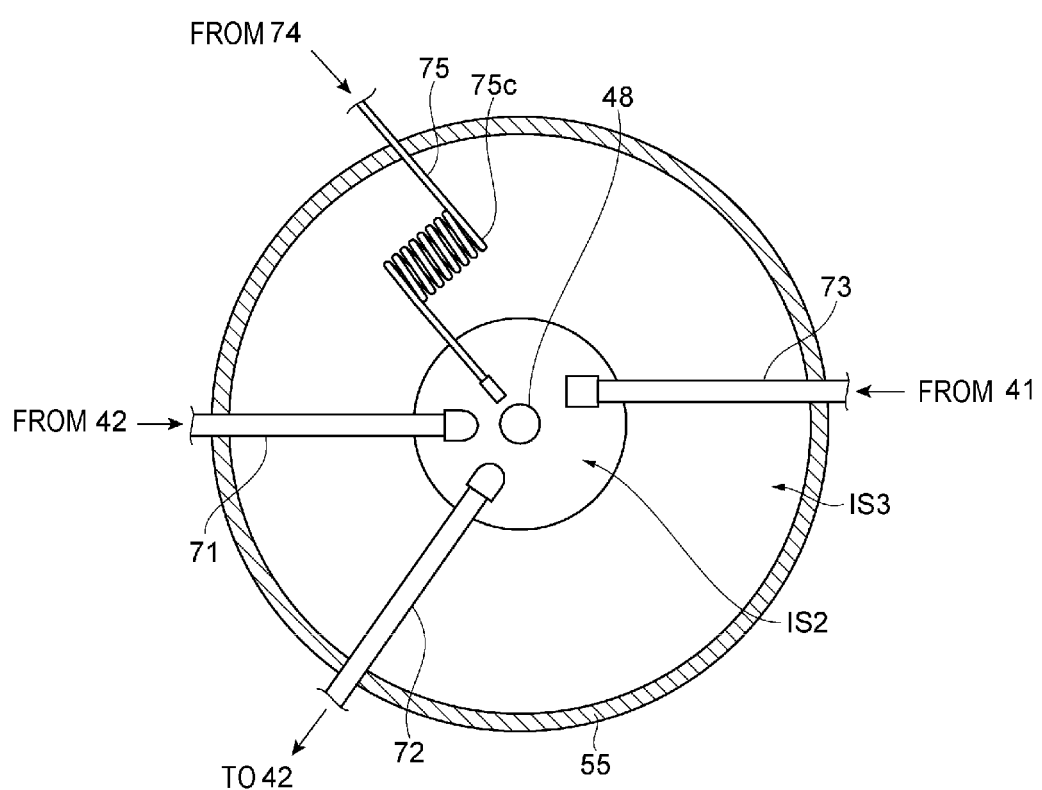
FIG. 4 is a plan view illustrating an internal configuration of a grounded conductor of the plasma processing apparatus illustrated in FIG. 2.

Hereinafter, a reference will be made on FIG. 4 together with FIG. 2. FIG. 4 is a plan view illustrating an internal configuration of the grounded conductor of the plasma processing apparatus illustrated in FIG. 2. FIG. 4 illustrates a state where the fifth portion 55 of the grounded conductor 50 is broken in a horizontal plane. In an embodiment, the plasma processing apparatus 10 further includes a pipe 71 (first pipe) as illustrated in FIGS. 2 and 4. The pipe 71 extends upward from the upper electrode 36 through the first space IS1 and the second space IS2, and passes through the third space IS3 so as to extend laterally and outwardly with respect to the grounded conductor 50. The pipe 71 is connected to the chiller unit 42 outside the grounded conductor 50. The coolant from the chiller unit 42 is supplied to the flow path 40p via the pipe 71. In the third space IS3, the pipe 71 is substantially shielded from the upper electrode 36 by the fourth portion 54 of the grounded conductor 50.

The plasma processing apparatus 10 further includes a pipe 72. The pipe 72 extends upward through the first space IS1 and the second space IS2, and passes through the third space IS3 so as to extend laterally and outwardly with respect to the grounded conductor 50. The pipe 72 is connected to the chiller unit 42 outside the grounded conductor 50. The coolant returns from the flow path 40p to the chiller unit 42 via the pipe 72. In the third space IS3, the pipe 72 is substantially shielded from the upper electrode 36 by the fourth portion 54 of the grounded conductor 50.

In an embodiment, the plasma processing apparatus 10 further includes a pipe 73 (second pipe). The pipe 73 extends upward from the upper electrode 36 through the first space IS1 and the second space IS2, and passes through the third space IS3 so as to extend laterally and outwardly with respect to the grounded conductor 50. The pipe 73 is connected to the gas supply unit 41 outside the grounded conductor 50. The gas output from the gas supply unit 41 is supplied to the upper electrode 36, i.e., the shower head via the pipe 73. In the third space IS3, the pipe 73 is substantially shielded from the upper electrode 36 by the fourth portion 54 of the grounded conductor 50. In addition, the gas supply unit 41 and the upper electrode 36 (i.e., the shower head) may be connected to each other via a plurality of pipes.

In an embodiment, the plasma processing apparatus 10 further includes a DC power supply 74 and a wire 75. The DC power supply 74 is configured to generate a negative DC voltage to be applied to the upper electrode 36. The wire 75 connects the DC power supply 74 and the upper electrode 36 to each other. The wire 75 may include a coil 75c. The coil 75c is provided in the third space IS3. The wire 75 extends upward from the upper electrode 36 through the first space IS1 and the second space IS, and passes through the third space IS3 so as to extend laterally and outwardly with respect to the grounded conductor 50. The wire 75 is electrically insulated from the fifth portion 55 and the grounded conductor 50. The wire 75 is connected to the DC power supply 74 outside the grounded conductor 50. In the third space IS3, the wire 75 is substantially shielded from the upper electrode 36 by the fourth portion 54 of the grounded conductor 50.

In an embodiment, the plasma processing apparatus 10 further includes a controller 80. The controller 80 is configured to control each part of the plasma processing apparatus 10. The controller 80 may be a computer device. The controller 80 may include a processor, a storage device such as a memory, an input device such as a keyboard, a mouse or a touch panel, a display device, and an input/output interface of a control signal, for example. The storage device stores a control program and recipe data. The processor of the controller 80 executes the control program and sends a control signal for controlling each part of the plasma processing apparatus 10 according to the recipe data. The controller 80 may control each part of the plasma processing apparatus 10 in order to execute the method MT.

Figure 5:
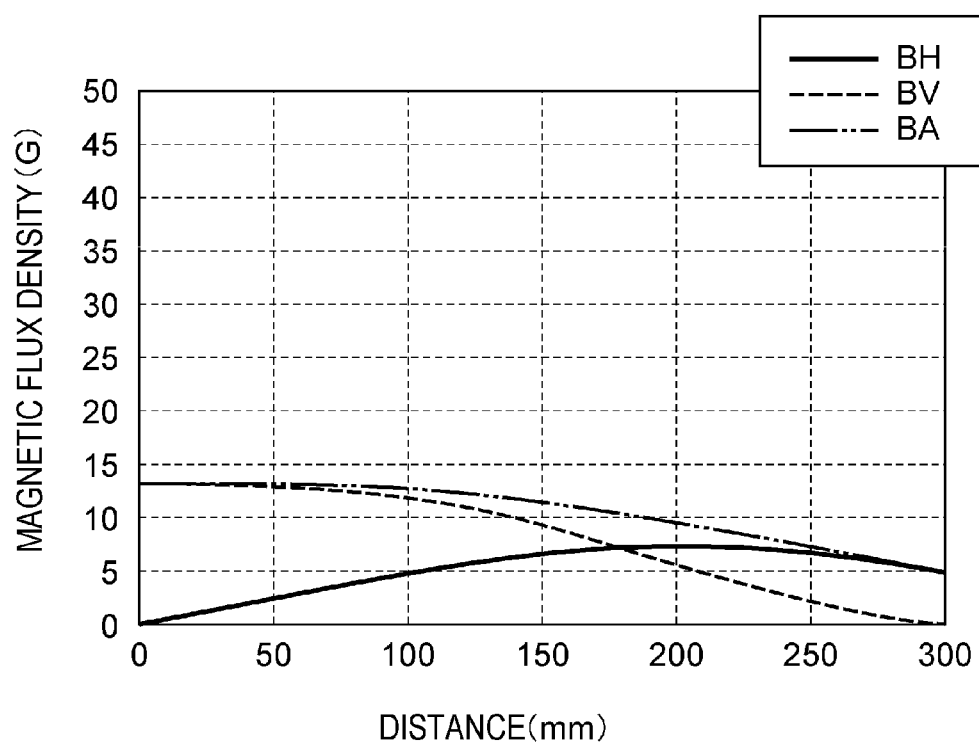
FIG. 5 is a view illustrating a calculation result of a magnetic field distribution that may be formed by the plasma processing apparatus illustrated in FIG. 2.

Hereinafter, a reference will be made on FIG. 5. FIG. 5 is a graph illustrating a calculation result of a magnetic field distribution that may be formed by the plasma processing apparatus illustrated in FIG. 2. In FIG. 5, the horizontal axis indicates the distance from the central axis AX, and the vertical axis indicates the magnetic flux density. FIG. 5 illustrates a magnetic flux density distribution indicating the distribution of a magnetic field BA, a magnetic flux density distribution indicating the distribution of a horizontal component BH of the magnetic field BA, and a magnetic flux density distribution indicating the distribution of a vertical component BV of the magnetic field BA. The distributions of the magnetic field and two components thereof illustrated in FIG. 5 are the distributions in the plane spaced apart downward from the lower end portion of the electromagnet 60 by 174 mm, i.e., the distributions in the upper surface of the stage 14. Conditions for calculating the distributions of the magnetic field and two components thereof illustrated in FIG. 5 are as follows.

<Calculation Conditions>
Inner diameter (radius) of the coil 64: 132 mm
Outer diameter (radius) of the coil 64: 173 mm
Number of turns of the coil 64: 215 turns
Current supplied to the coil 64: 4 [A]
Distance between the lower end of the electromagnet 60 and the workpiece W placed on the stage 14: 174 mm As can be seen from the calculation result of the magnetic field distribution illustrated in FIG. 5, according to the electromagnet 60, it is possible to form a magnetic field distribution having a horizontal component in a portion spaced apart from the central axis AX greater than a horizontal component on the central axis AX.

Figure 6:
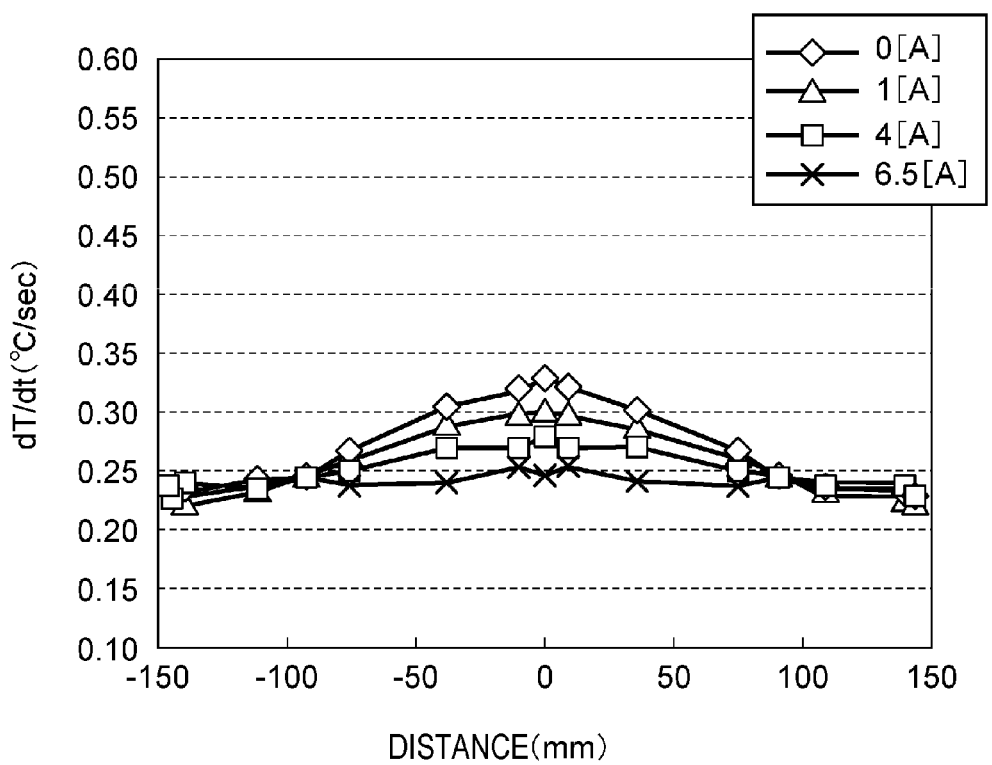
FIG. 6 is a graph illustrating a measurement result of an ion flux distribution in the inner space of the plasma processing apparatus illustrated in FIG. 2.

Hereinafter, a reference will be made on FIG. 6. FIG. 6 is a graph illustrating a measurement result of an ion flux distribution in the inner space of the plasma processing apparatus illustrated in FIG. 2. In an experiment for obtaining the measurement result illustrated in FIG. 6, a magnetic field was formed in the inner space 12s by the electromagnet 60 by generating plasma in the inner space 12s in a state where a disk-shaped sample is placed on the stage 14. Then, the rate of increase per unit time (dT/dt) of the temperature of the sample was obtained at a plurality of measurement points on the diameter of the sample. In addition, the rate of increase (dT/dt) is a parameter that reflects the amount of ion flux. In the experiment, an ion flux distribution was measured by setting the current supplied to the coil 64 of the electromagnet 60 to 0 [A], 1 [A], 4 [A], and 6.5 [A]. Other conditions of the experiment are described below.

<Conditions of Experiment>
Pressure of the inner space 12s: 20 mTorr (2.67 Pa)
Gas supplied to the inner space 12s: Ar gas at 1000 sccm
First radio frequency waves: 60 MHz, 100 W
Second radio frequency waves: 40 MHz, 100 W In FIG. 6, the horizontal axis indicates the position of each of the plurality of measurement points and the distance from the central axis AX. The measurement point specified by a positive distance is on one side with respect to the central axis AX on the above-described diameter and the measurement point specified by a negative distance is on the other side with respect to the central axis AX on the above-described diameter. In FIG. 6, the vertical axis indicates the rate of increase (dT/dt). As illustrated in FIG. 6, when the current supplied to the coil 64 of the electromagnet 60 is 0 [A], the rate of increase (dT/dt), i.e., the ion flux was reduced with increasing distance from the central axis AX. That is, when the current supplied to the coil 64 is 0 [A], a non-uniform plasma density distribution was formed. When the current supplied to the coil 64 increases, the difference in ion flux between the plurality of measurement points was reduced. That is, it was confirmed that a uniform plasma density distribution may be formed by forming a magnetic field in the inner space 12s by the electromagnet 60.

Referring again to FIG. 1, the method MT will be described by taking a case where the plasma processing apparatus 10 is used as an example. The method MT is executed in a state where the workpiece W is accommodated in the inner space 12s of the chamber main body 12. As illustrated in FIG. 1, the method MT includes steps ST1 and ST2.

In step ST1, a first plasma processing is executed on the workpiece W. In step ST1, the workpiece W is processed by plasma of a first gas supplied to the inner space 12s. In step ST1, second radio frequency waves may be supplied or may not be supplied to the lower electrode 18. When the second radio frequency waves are supplied to the lower electrode 18 in step ST1, power of the second radio frequency waves set in step ST1 is less than power of the second radio frequency waves supplied to the lower electrode 18 in step ST2.

In step ST2, a second plasma processing is performed on the workpiece W. In step ST2, the workpiece W is processed by plasma of a second gas supplied to the inner space 12s. In step ST2, the second radio frequency waves are supplied to the lower electrode 18. In step ST2, power of the second radio frequency waves is set to be greater than power of the second radio frequency waves in step ST1. In an embodiment, a frequency of the second radio frequency waves is greater than 13.56 MHz. The frequency of the second radio frequency waves may be equal to or greater than 40 MHz, and may be equal to or greater than 60 MHz.

In step ST2, a magnetic field distribution having a horizontal component on the edge side of the workpiece W greater than a horizontal component on the center of the workpiece W is formed in the inner space 12s by the electromagnet 60.

Step ST1 and step ST2 may be alternately repeated. When step ST1 and step ST2 are alternately repeated, it is determined in step ST3 whether or not a stop condition is satisfied. The stop condition is determined to be satisfied, for example, when the number of times a sequence including step ST1 and step ST2 is executed has reached a predetermined number of times. When it is determined in step ST3 that the stop condition is not satisfied, step ST1 is executed again, and subsequently, step ST2 is executed. On the other hand, when it is determined in step ST3 that the stop condition is satisfied, the execution of the method MT ends.

In step ST2 of the method MT, the power of the second radio frequency waves is set to be higher than the power of the second radio frequency waves set in step ST1. Thus, while the second plasma processing in step ST2 is executed, the electric field intensity on the center of the workpiece W increases, and the electric field intensity on the edge side of the workpiece W decreases. That is, while the second plasma processing is executed, a non-uniform electric field intensity distribution is formed in the radiation direction with respect to the central axis AX. While the second plasma processing is executed, the above-described magnetic field distribution is formed in the inner space 12s. In a portion in which a magnetic field having a high horizontal component is formed, the stay time of electrons increases. As a result, the density of plasma increases in the portion in which the magnetic field having the high horizontal component is formed. Therefore, a uniform plasma density distribution is made during the execution of the second plasma processing. Moreover, since a uniform plasma density distribution is made by the magnetic field distribution formed by the electromagnet 60, a uniform plasma density distribution may be made at a high speed at a point in time at which a plasma processing to be executed is switched from the first plasma processing to the second plasma processing. When step ST1 and step ST2 are alternately repeated, it is particularly advantageous to use the electromagnet 60 capable of making a uniform plasma density distribution at a high speed.

In an embodiment, the first gas includes a fluorocarbon gas, for example, $C_4F_8$ gas. The second gas includes a rare gas such as He gas, Ne gas, Ar gas, Kr gas, or Xe gas. The method MT of the embodiment may selectively etch a first region formed of silicon oxide with respect to a second region formed of silicon nitride.

Figure 7:
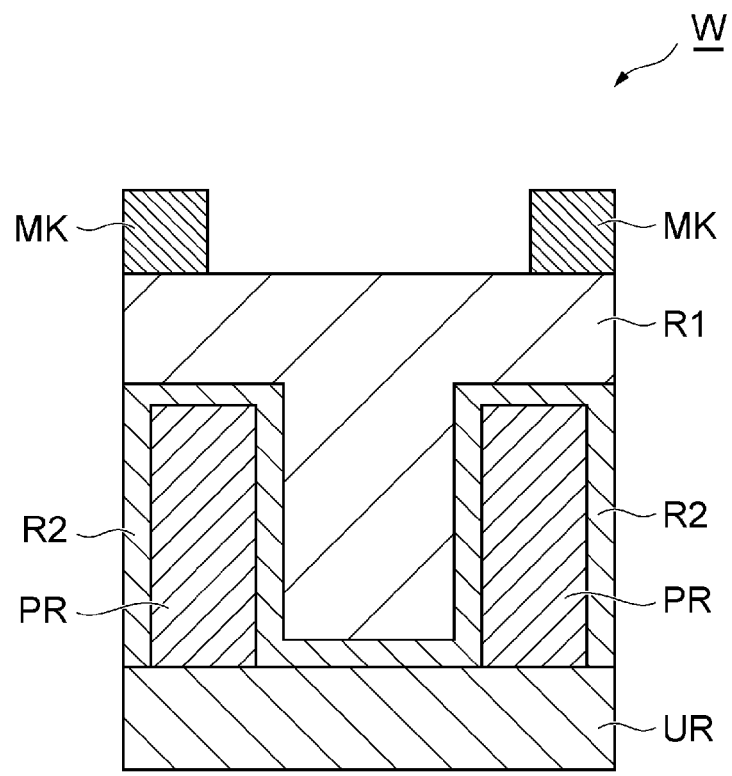
FIG. 7 is a partially enlarged cross-sectional view of an exemplary workpiece to which an embodiment of the method illustrated in FIG. 1 is applicable.

FIG. 7 is a partially enlarged cross-sectional view of an workpiece to which an embodiment of the method illustrated in FIG. 1 is applicable. The workpiece W illustrated in FIG. 7 includes an underlying region UR, a plurality of protruding regions PR, a first region R1, a second region R2, and a mask MK. The workpiece W may be, for example, a product obtained during the manufacture of a fin field effect transistor.

The underlying region UR may be formed of polycrystalline silicon, for example. In an example, the underlying region UR is a fin region and has a substantially rectangular parallelepiped shape. The plurality of protruding regions PR are provided on the underlying region UR, and are arranged substantially in parallel to each other. These protruding regions PR may be, for example, gate regions. The second region R2 is formed of silicon nitride. The second region R2 is provided so as to cover the protruding regions PR and the underlying region UR. The second region R2 provides a recess between two adjacent protruding regions PR. The first region R1 is formed of silicon oxide. The first region R1 is provided in the above-described recess that may be provided by the second region R2. In addition, the first region R1 is provided so as to cover the second region R2. The mask MK is provided on the first region R1. The mask MK is patterned so as to provide an opening above the recess provided by the second region R2. The width of the opening in the mask MK is greater than the width of the recess provided by the second region R2. The mask MK is a mask formed of an organic film. The mask MK may be formed by a photolithography technique.

Figure 8:
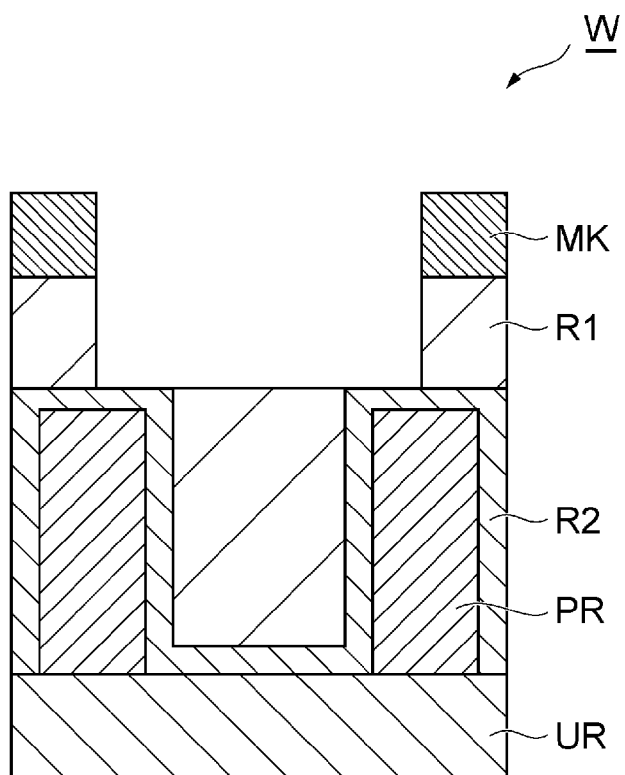
FIG. 8 is a partially enlarged cross-sectional view of the workpiece processed from a state illustrated in FIG. 7.
Figure 9A:
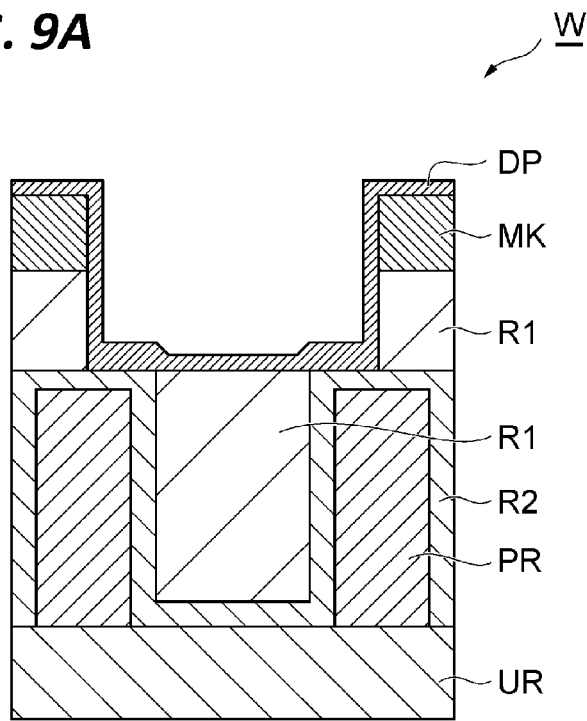
FIG. 9A is a partially enlarged cross-sectional view of the workpiece in a state after execution of step ST1 in an embodiment of the method illustrated in FIG. 1.
Figure 9B:
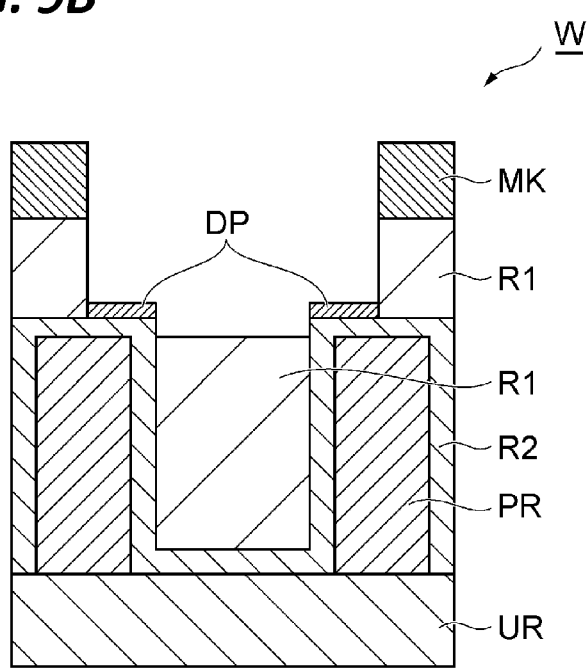
FIG. 9B is a partially enlarged cross-sectional view of the workpiece in a state after execution of step ST2 in the embodiment of the method illustrated in FIG. 1.
Figure 10:
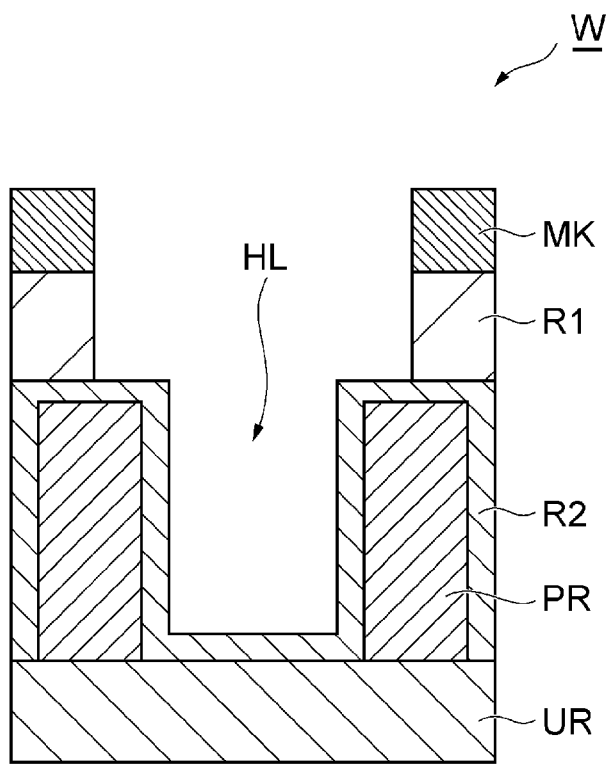
FIG. 10 is a partially enlarged cross-sectional view of the workpiece after the embodiment of the method illustrated in FIG. 1 is applied.

Hereinafter, the method MT of an embodiment will be described by taking a case of being applied to the workpiece W illustrated in FIG. 7 as an example. However, the method MT of the embodiment may be applied to any other workpiece including a first region formed of silicon oxide and a second region formed of silicon nitride. Hereinafter, a reference will be made on FIGS. 8, 9A, 9B and 10, in addition to FIGS. 1 and 7. FIG. 8 is a partially enlarged cross-sectional view of the workpiece processed from a state illustrated in FIG. 7. FIG. 9A is a partially enlarged cross-sectional view of the workpiece in a state after execution of step ST1 in the embodiment of the method illustrated in FIG. 1, and FIG. 9B is a partially enlarged cross-sectional view of the workpiece in a state after execution of step ST2 in the embodiment of the method illustrated in FIG. 1. FIG. 10 is a partially enlarged cross-sectional view of the workpiece after the embodiment of the method illustrated in FIG. 1 is applied.

In the method MT of the embodiment, the first region R1 may be etched only by step ST1 and step ST2. Alternatively, the first region R1 may be etched by another plasma etching processing before step ST1 is initially executed, until the second region R2 is exposed (see FIG. 8), or just before the second region R2 is exposed. For example, the first region R1 may be etched by active species such as ions and/or radicals from plasma of a fluorocarbon gas until the second region R2 is exposed (see FIG. 8), or just before the second region R2 is exposed.

In step ST1 of the method MT of the embodiment, the workpiece W is processed with plasma of the above-described first gas including a fluorocarbon gas. In addition to the fluorocarbon gas, the first gas may include a rare gas such as oxygen gas and Ar gas. In step ST1, a deposit film DP containing fluorocarbon is formed on the workpiece W. In step ST1, the film DP is formed so that the film thickness of the film DP on the second region R2 is greater than the film thickness of the film DP on the first region R1.

Specifically, in step ST1, the first gas is supplied to the inner space 12s, and the pressure in the inner space 12s is reduced to a designated pressure by the exhaust device 34. By supplying the first radio frequency waves, the first gas is excited in the inner space 12s. As a result, plasma of the first gas is generated in the inner space 12s. In step ST1, the power of the second radio frequency waves is set to be less than the power of the second radio frequency waves in step ST2. In step ST1, the second radio frequency waves may not be supplied to the lower electrode 18.

In step ST1, the temperature of the workpiece W is set to 20° C. or higher and 250° C. or lower. The temperature of the workpiece W is adjusted by the heat exchange medium supplied to the flow path 18p and the above-described one or more heaters provided in the electrostatic chuck 20. When the temperature of the workpiece W is set to such a temperature, as illustrated in FIG. 9A, the deposit film DP containing fluorocarbon is formed on the workpiece W. As illustrated in FIG. 9A, the film thickness of the film DP is large on the second region R2 and is small on the first region R1. In addition, the temperature exceeding 250° C. is the glass transition temperature of the mask MK, and at this temperature, the difference between the film thickness of the film DP formed on the first region R1 and the film thickness of the film DP formed on the second region R2 is reduced. In addition, even at a temperature lower than 20° C., the difference between the film thickness of the film DP formed on the first region R1 and the film thickness of the film DP formed on the second region R2 is reduced.

In step ST2, the workpiece W processed in step ST1 is processed by plasma of the above-described second gas including a rare gas. The second gas may be a gas including only the rare gas. Alternatively, the second gas may include oxygen gas, in addition to the rare gas. In step ST2, the second gas is supplied to the inner space 12s, and the pressure in the inner space 12s is reduced to a designated pressure by the exhaust device 34. By supplying the second radio frequency waves, the second gas is excited in the inner space 12s. As a result, plasma of the second gas is generated in the inner space 12s. In step ST2, the second radio frequency waves are supplied to the lower electrode 18. In step ST2, the power of the second radio frequency waves is set to be greater than the power of the second radio frequency waves in step ST1.

In step ST2, the workpiece W is irradiated with ions of the rare gas. When the film DP is irradiated with the ions of the rare gas, the first region R1 is etched by radicals of fluorocarbon contained in the film DP. On the other hand, the film DP on the second region R2 decreases, but protects the second region R2 so as to prevent etching of the second region R2. When step ST2 is executed, the workpiece W illustrated in FIG. 9A becomes a state illustrated in FIG. 9B. Then, by alternately repeating steps ST1 and ST2, as illustrated in FIG. 10, the first region R1 in the recess provided by the second region R2 is removed, so that an opening HL is formed. That is, the opening HL is formed in a self-aligning manner.

Incidentally, when the width of the recess provided by the second region R2 is small, by execution of step ST1, a thick deposit film is formed on the first region R1 that is present in the narrow recess. When the thick deposit film is formed on the first region R1, the etching of the first region R1 does not proceed in step ST2. Thus, when the width of the recess provided by the second region R2 is narrow, it is necessary to reduce the film thickness of the deposit film DP formed on the workpiece W. When the film thickness of the deposit film DP is small, in order to prevent etching of the second region R2, it is necessary to lower the energy of ions of the rare gas with which the workpiece W is irradiated. The energy of the ions is lowered by using the second radio frequency waves having a radio frequency. For example, the second radio frequency waves having a frequency greater than 13.56 MHz, a frequency of 40 MHz or higher, or a frequency of 60 MHz or higher are used. When the second radio frequency waves having a radio frequency are used, the non-uniformity of the electric field intensity distribution formed in step ST2 becomes more conspicuous. Such non-uniformity is eliminated or suppressed by forming the above-described magnetic field by the electromagnet 60 in step ST2.

While various embodiments have been described above, various modifications may be made without being limited to the above-described embodiments. The method MT may be executed using a plasma processing apparatus other than the plasma processing apparatus 10, i.e., an arbitrary plasma processing apparatus that is capable of supplying second radio frequency waves (bias radio frequency waves) to the lower electrode and that is capable of forming the same magnetic field distribution as the magnetic field distribution formed by the electromagnet 60 in the inner space of the chamber body. As such a plasma processing apparatus, a capacitively coupled plasma processing apparatus configured to supply first radio frequency waves to a lower electrode, an inductively coupled plasma processing apparatus, or a plasma processing apparatus configured to excite a gas by surface waves such as microwaves is illustrated.

In addition, the electromagnet of the plasma processing apparatus used in the method MT may include one or more coils.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method for a workpiece in a plasma processing apparatus, the plasma processing apparatus including:
    a chamber body configured to provide an inner space;
        a stage configured to provide a placing region for the workpiece, and
        provided in the inner space, the center of the placing region being located on a central axis of the chamber body;
        a lower electrode provided in the stage;
        a gas supply unit configured to supply a first gas and a second gas to the inner space of the chamber body;
        a first radio frequency power supply configured to supply first radio frequency waves;
        a second radio frequency power supply electrically connected to the lower electrode and configured to supply second radio frequency waves having a frequency lower than a frequency of the first radio frequency waves; and
        an electromagnet configured to form a magnetic field in the inner space of the chamber body,
    the plasma processing method comprising:
        providing the workpiece in the inner space of the chamber body;
        performing a first plasma processing on the workpiece by plasma generated from a first gas supplied to the inner space; and
        performing a second plasma processing on the workpiece by plasma generated from a second gas supplied to the inner space,
        wherein power of the second radio frequency waves set in the second plasma processing is greater than power of the second radio frequency waves set in the first plasma processing, and
        in the second plasma processing, a magnetic field distribution having a horizontal component on an edge side of the workpiece that is greater than a horizontal component on a center of the workpiece is formed by the electromagnet.

2. The plasma processing method of claim 1, further comprising alternately repeating the first plasma processing and the second plasma processing.

3. The plasma processing method of claim 1, wherein the workpiece includes a first region formed of silicon oxide and a second region formed of silicon nitride,
    the first gas includes a fluorocarbon gas,
    the first plasma processing forms a deposit film containing fluorocarbon on the workpiece,
    the second gas includes a rare gas, and
    the second plasma processing irradiates the workpiece having the deposit film with ions of the rare gas to etch the first region.

4. The plasma processing method of claim 3, wherein a recess formed by the second region includes the first region.

5. The plasma processing method of claim 1, wherein the frequency of the second radio frequency waves is greater than 13.56 MHz.

6. The plasma processing method of claim 5, wherein the frequency of the second radio frequency waves is equal to or greater than 40 MHz.

7. The plasma processing method of claim 5, wherein the frequency of the second radio frequency waves is equal to or greater than 60 MHz.

* * * * *